(12) United States Patent
Chang et al.

(10) Patent No.: US 11,967,357 B2
(45) Date of Patent: Apr. 23, 2024

(54) MEMORY UNIT WITH TIME DOMAIN EDGE DELAY ACCUMULATION FOR COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Meng-Fan Chang, Hsinchu (TW); Ping-Chun Wu, Hsinchu (TW); Li-Yang Hong, Hsinchu (TW); Jin-Sheng Ren, Hsinchu (TW); Jian-Wei Su, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 233 days.

(21) Appl. No.: 17/580,651

(22) Filed: Jan. 21, 2022

(65) Prior Publication Data
US 2023/0238047 A1 Jul. 27, 2023

(51) Int. Cl.
*G11C 8/00* (2006.01)
*G11C 11/4074* (2006.01)
*G11C 11/4076* (2006.01)
*G11C 11/408* (2006.01)
*G11C 11/4094* (2006.01)
*G11C 11/4096* (2006.01)
*H03K 19/173* (2006.01)

(52) U.S. Cl.
CPC ...... *G11C 11/4076* (2013.01); *G11C 11/4074* (2013.01); *G11C 11/4085* (2013.01); *G11C 11/4094* (2013.01); *G11C 11/4096* (2013.01); *H03K 19/1737* (2013.01)

(58) Field of Classification Search
CPC ............ G11C 11/4076; G11C 11/4074; G11C 11/4085; G11C 11/4094; G11C 11/4096
USPC ....................................... 365/233.1
See application file for complete search history.

(56) References Cited

U.S. PATENT DOCUMENTS

| | | | | |
|---|---|---|---|---|
| 11,211,113 B1 * | 12/2021 | Derner | ................ | G11C 11/4099 |
| 11,392,820 B2 * | 7/2022 | Chang | ..................... | G11C 11/54 |
| 11,495,287 B2 * | 11/2022 | Chang | ..................... | G06N 3/045 |

(Continued)

FOREIGN PATENT DOCUMENTS

| | | | | |
|---|---|---|---|---|
| CN | 110782026 A | * | 2/2020 | ............... G06N 3/04 |
| CN | 114499538 A | * | 5/2022 | |

(Continued)

*Primary Examiner* — Viet Q Nguyen
(74) *Attorney, Agent, or Firm* — CKC & Partners Co., LLC

(57) ABSTRACT

A memory unit with time domain edge delay accumulation for computing-in-memory applications is controlled by a first word line and a second word line. The memory unit includes at least one memory cell, at least one edge-delay cell multiplexor and at least one edge-delay cell. The at least one edge-delay cell includes a weight reader and a driver. The weight reader is configured to receive a weight and a multi-bit analog input voltage and generate a multi-bit voltage according to the weight and the multi-bit analog input voltage. The driver is connected to the weight reader and configured to receive an edge-input signal. The driver is configured to generate an edge-output signal having a delay time according to the edge-input signal and the multi-bit voltage. The delay time of the edge-output signal is positively correlated with the multi-bit analog input voltage multiplied by the weight.

20 Claims, 7 Drawing Sheets

(56) References Cited

U.S. PATENT DOCUMENTS

| | | | |
|---|---|---|---|
| 11,507,275 B2 * | 11/2022 | Chang .................. | G06F 3/0655 |
| 11,610,626 B2 * | 3/2023 | Tachibana ........... | G11C 11/4097 |
| 2022/0044714 A1 * | 2/2022 | Chang .................. | G11C 11/419 |
| 2022/0129153 A1 * | 4/2022 | Chang .................. | G06F 3/0655 |
| 2022/0223197 A1 * | 7/2022 | Xue .................... | G11C 11/4094 |
| 2022/0262426 A1 * | 8/2022 | Chiou .................. | G11C 11/413 |
| 2022/0366968 A1 * | 11/2022 | Liu ..................... | G11C 11/4094 |
| 2023/0238055 A1 * | 7/2023 | Pasotti ................ | G11C 11/4074 |
| | | | 365/230.03 |
| 2023/0259331 A1 * | 8/2023 | Chang .................. | G04F 10/005 |
| | | | 708/603 |

FOREIGN PATENT DOCUMENTS

| | | | | |
|---|---|---|---|---|
| CN | 115794728 A | * | 3/2023 | |
| JP | 3658079 B2 | * | 6/2005 | ............ G06F 7/509 |
| TW | 202205295 A | * | 2/2022 | ............ G06N 3/063 |

* cited by examiner

MEMORY UNIT WITH TIME DOMAIN EDGE DELAY ACCUMULATION FOR COMPUTING-IN-MEMORY APPLICATIONS AND COMPUTING METHOD THEREOF

BACKGROUND

Technical Field

The present disclosure relates to a memory unit for computing-in-memory applications and a computing method thereof. More particularly, the present disclosure relates to a memory unit with time domain edge delay accumulation for computing-in-memory applications and a computing method thereof.

Description of Related Art

Computing-In-Memory (CIM) is a promising solution that can reduce the power consumption of AI chip multiplication and accumulation (MAC) operations. In order to increase the bandwidth and reduce the power consumption of each operation, CIM would turn on multiple word lines (WL) in a memory array to compute at the same time. The computing results will accumulate on bit lines (BL) and read out by an analog-to-digital converter (ADC) which is one of the current development directions. However, the signal margin of the MAC value is restricted by the magnitude of a power supply voltage VDD, thereby causing serious error when sensing the values. In addition, the readout circuits are the main source of power consumption when computing MAC operation. Reducing the effect of the power supply voltage VDD to signal margin and improving the performance of readout circuits are two of the challenges to achieve low power consumption and high accuracy in CIM. Accordingly, a memory unit with time domain edge delay accumulation for computing-in-memory applications and a computing method thereof having the features of improving the problem of restricted signal margin and saving power consumption and area are commercially desirable.

SUMMARY

According to one aspect of the present disclosure, a memory unit with time domain edge delay accumulation for computing-in-memory applications is controlled by a first word line and a second word line. The memory unit with time domain edge delay accumulation for computing-in-memory applications includes at least one memory cell, at least one edge-delay cell multiplexor and at least one edge-delay cell. The at least one memory cell stores a weight. The at least one memory cell is controlled by the first word line and includes a local bit line transmitting the weight. The at least one edge-delay cell multiplexor is connected to the at least one memory cell and controlled by the second word line. The at least one edge-delay cell is connected to the at least one edge-delay cell multiplexor and includes a weight reader and a driver. The weight reader is configured to receive the weight and a multi-bit analog input voltage and generate a multi-bit voltage according to the weight and the multi-bit analog input voltage. The driver is connected to the weight reader and configured to receive an edge-input signal. The driver is configured to generate an edge-output signal having a delay time according to the edge-input signal and the multi-bit voltage. The delay time of the edge-output signal is positively correlated with the multi-bit analog input voltage multiplied by the weight.

According to another aspect of the present disclosure, a memory unit with time domain edge delay accumulation for computing-in-memory applications is controlled by a first word line and a second word line. The memory unit with time domain edge delay accumulation for computing-in-memory applications includes at least one sub-array memory cell module, at least one edge-delay cell multiplexor and at least one edge-delay cell. The at least one sub-array memory cell module includes at least one first-column memory cell and at least one second-column memory cell. The at least one first-column memory cell stores a first weight. The at least one first-column memory cell is controlled by the first word line and includes a first-column local bit line transmitting the first weight. The at least one second-column memory cell stores a second weight. The at least one second-column memory cell is controlled by the first word line and includes a second-column local bit line transmitting the second weight. The at least one edge-delay cell multiplexor is connected to the at least one sub-array memory cell module and controlled by the second word line. The at least one edge-delay cell multiplexor is configured to generate one of the first weight and the second weight. The at least one edge-delay cell is connected to the at least one edge-delay cell multiplexor and configured to receive a multi-bit analog input voltage, an edge-input signal and the one of the first weight and the second weight. The at least one edge-delay cell is configured to generate an edge-output signal having a delay time according to the multi-bit analog input voltage, the edge-input signal and the one of the first weight and the second weight. The delay time of the edge-output signal is positively correlated with the multi-bit analog input voltage multiplied by the one of the first weight and the second weight.

According to further another aspect of the present disclosure, a computing method of a memory unit with time domain edge delay accumulation for computing-in-memory applications is controlled by a first word line and a second word line. The computing method includes performing a voltage level applying step and a computing step. The voltage level applying step includes applying a plurality of voltage levels to the first word line, the second word line, a weight, a multi-bit analog input voltage, an edge-input signal, a reset signal, a first power supply voltage and a second power supply voltage of the memory unit, respectively. The computing step includes configuring the at least one edge-delay cell of the memory unit to compute the multi-bit analog input voltage, the edge-input signal and the weight to generate an edge-output signal having a delay time. The delay time of the edge-output signal is positively correlated with the multi-bit analog input voltage multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
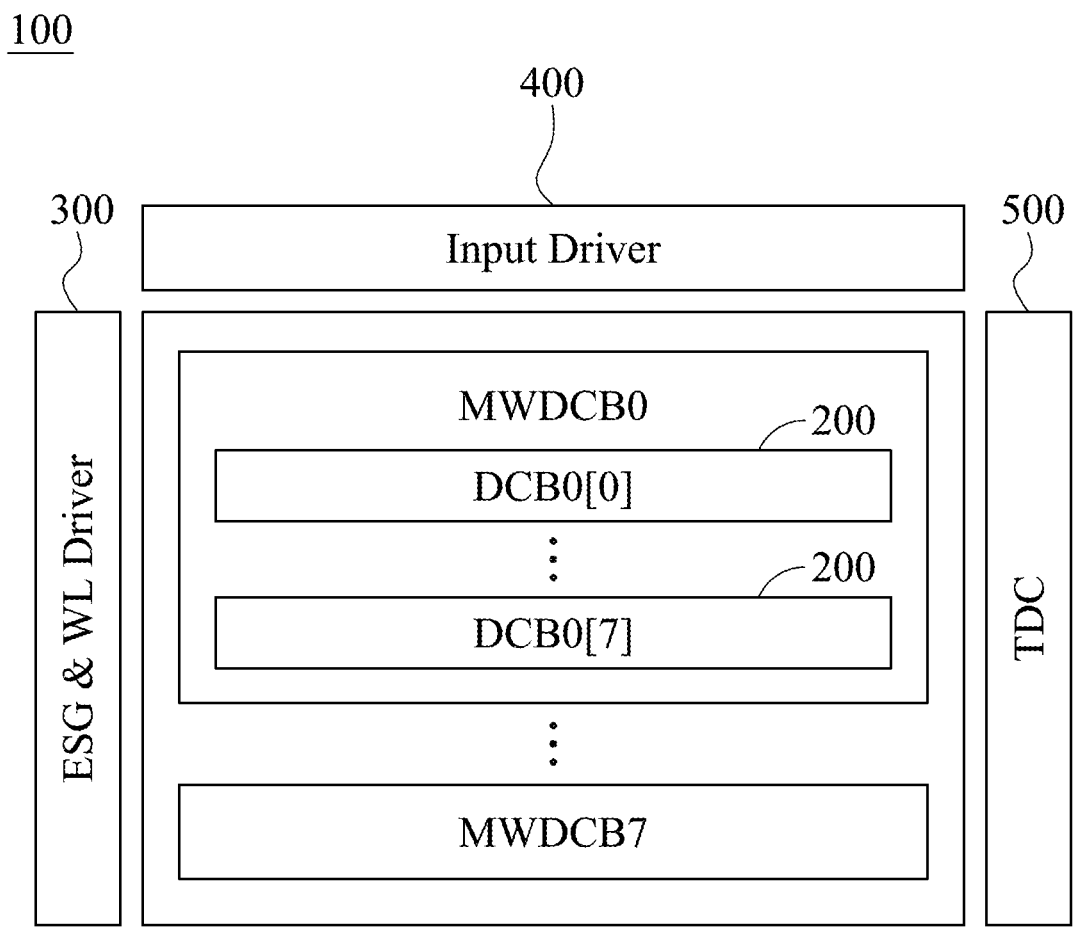
FIG. 1 shows a block diagram of a memory array structure with time domain edge delay accumulation for computing-in-memory applications according to a first embodiment of the present disclosure.
Figure 2:
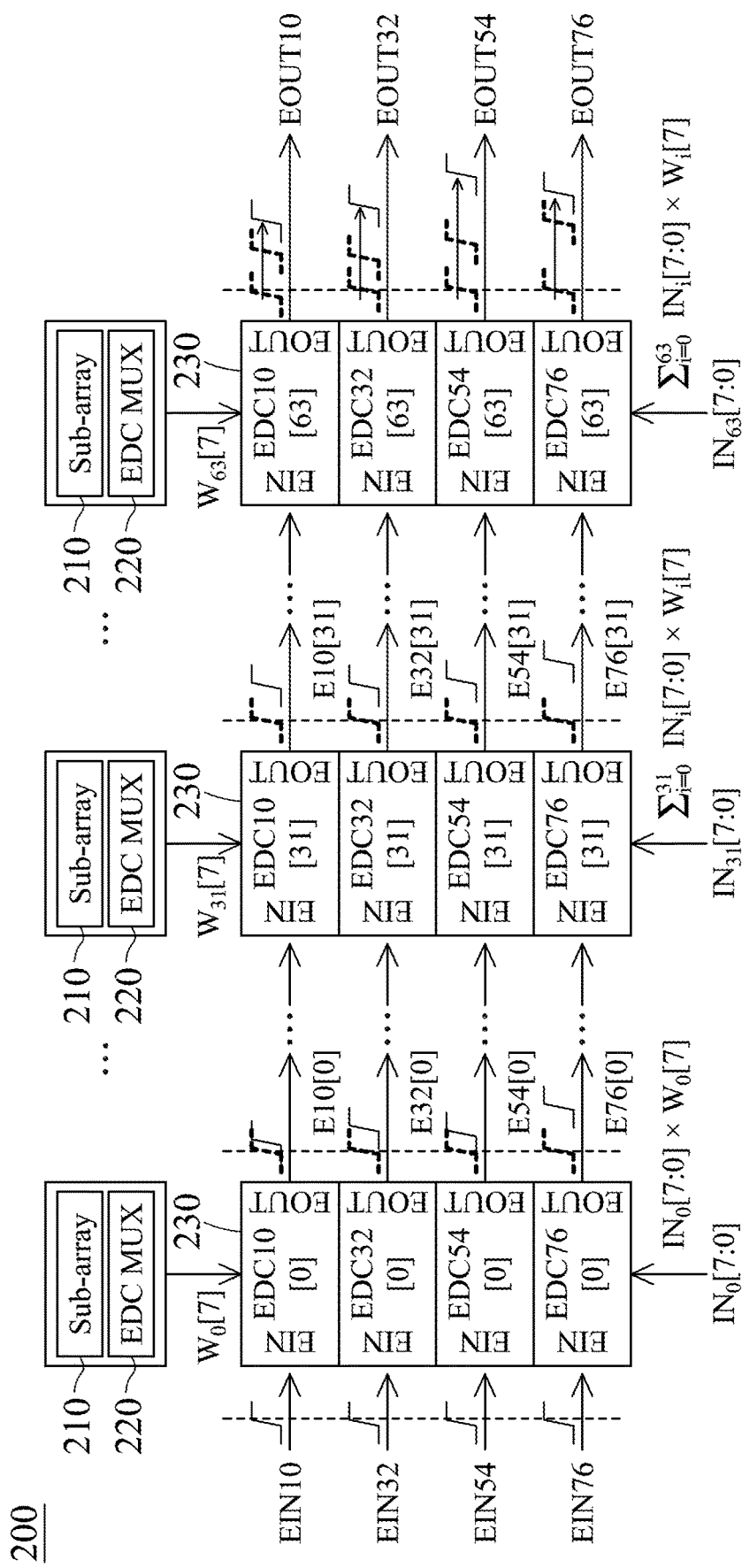
FIG. 2 shows a circuit diagram of one of a plurality of memory units with time domain edge delay accumulation for computing-in-memory applications of the memory array structure with time domain edge delay accumulation for computing-in-memory applications of FIG. 1.
Figure 3:
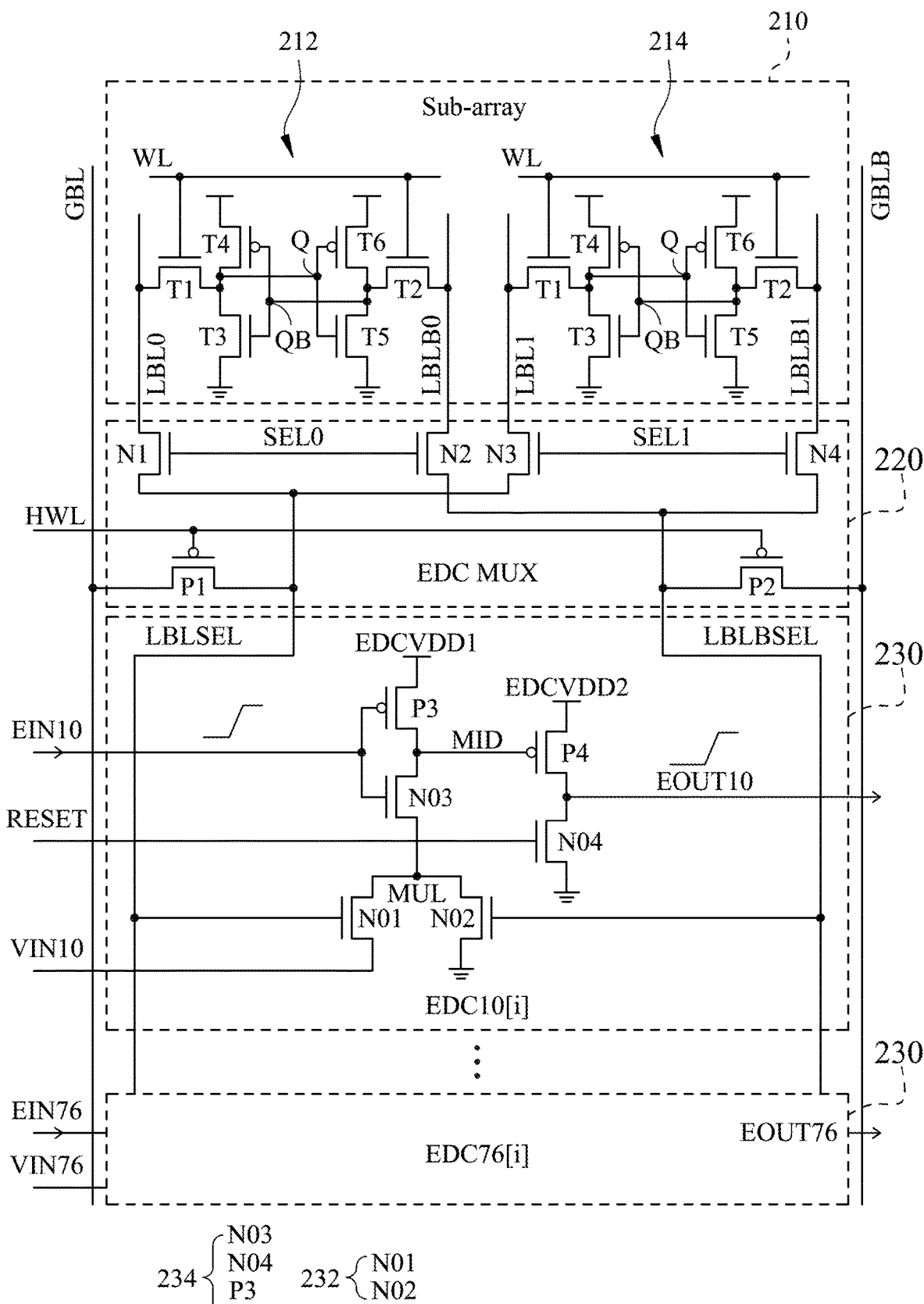
FIG. 3 shows a circuit diagram of a sub-array memory cell module, an edge-delay cell multiplexor and a plurality of edge-delay cells of the memory unit with time domain edge delay accumulation for computing-in-memory applications of FIG. 2.
Figure 4:
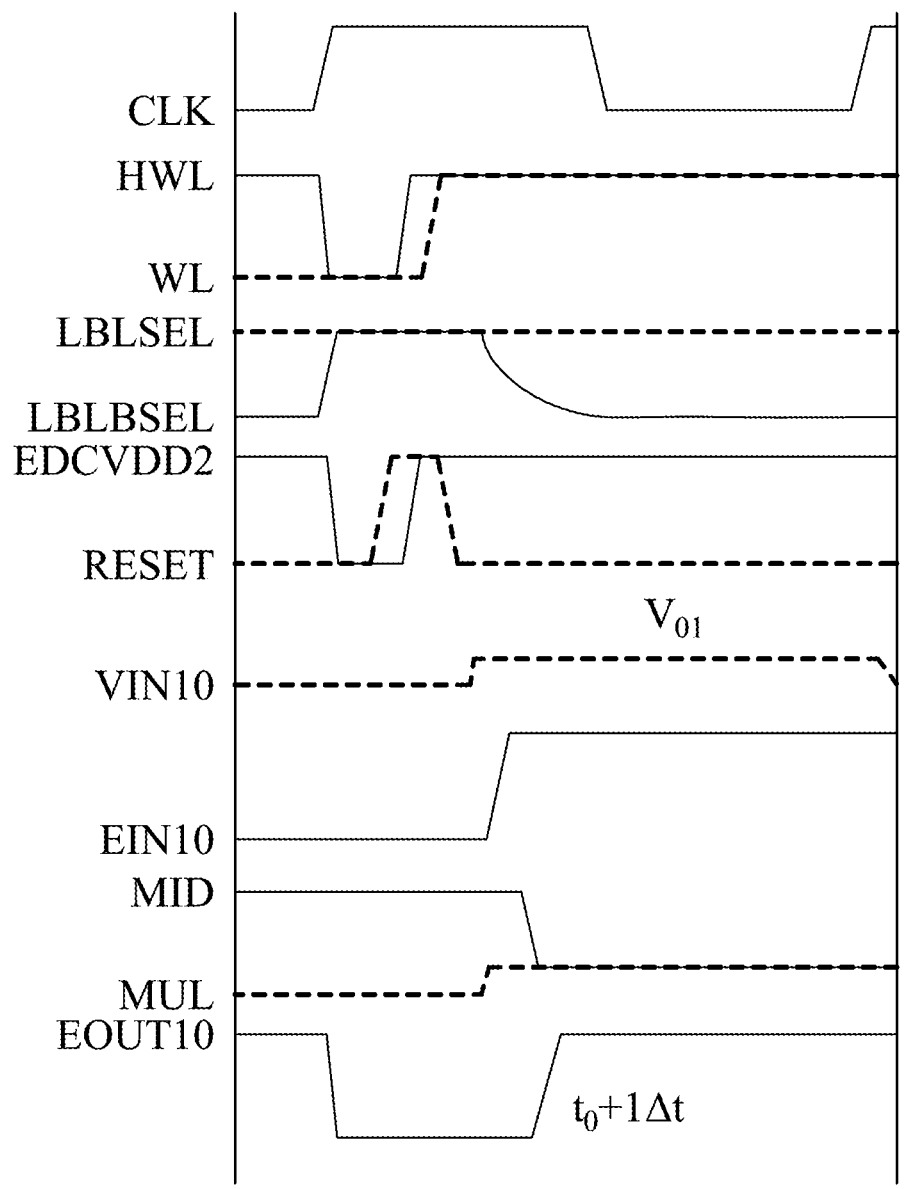
FIG. 4 shows a timing diagram associated with the sub-array memory cell module, the edge-delay cell multiplexor and the edge-delay cells of FIG. 3, when a multi-bit analog input voltage is equal to $V_{O1}$.
Figure 5:
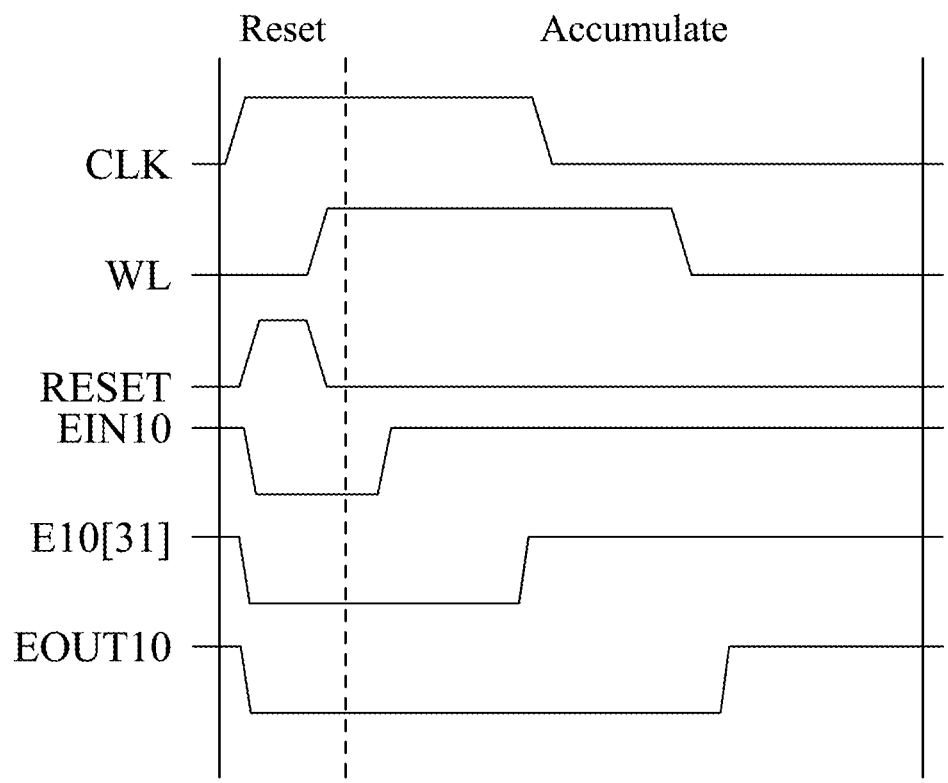
FIG. 5 shows a timing diagram associated with the one of the memory units with time domain edge delay accumulation for computing-in-memory applications of FIG. 2.

Please refer to FIGS. 1-5. FIG. 1 shows a block diagram of a memory array structure 100 with time domain edge delay accumulation for computing-in-memory (CIM) applications according to a first embodiment of the present disclosure. FIG. 2 shows a circuit diagram of one of a plurality of memory units 200 (Delay Computing Block, DCB) with time domain edge delay accumulation for computing-in-memory applications of the memory array structure 100 with time domain edge delay accumulation for computing-in-memory applications of FIG. 1. FIG. 3 shows a circuit diagram of a sub-array memory cell module 210 (Sub-array), an edge-delay cell multiplexor 220 (EDC MUX) and a plurality of edge-delay cells 230 (EDC10[i], EDC76[i]) of the memory unit 200 with time domain edge delay accumulation for computing-in-memory applications of FIG. 2. FIG. 4 shows a timing diagram associated with the sub-array memory cell module 210, the edge-delay cell multiplexor 220 and the edge-delay cells 230 of FIG. 3, when a multi-bit analog input voltage VIN10 is equal to $V_{O1}$. FIG. 5 shows a timing diagram associated with the one of the memory units 200 with time domain edge delay accumulation for computing-in-memory applications of FIG. 2. In FIGS. 1-5, the memory array structure 100 with time domain edge delay accumulation for computing-in-memory applications is controlled by a first word line WL and a second word line HWL. The memory array structure 100 with time domain edge delay accumulation for computing-in-memory applications includes a plurality of multi-bit weight delay computing blocks MWDCB0-MWDCB7, a word line driver unit 300, an input driver 400 and a time-to-digital converter 500 (TDC).

The structures of the multi-bit weight delay computing blocks MWDCB0-MWDCB7 are the same with each other. Each of the multi-bit weight delay computing blocks MWDCB0-MWDCB7 includes eight memory units 200 (i.e., DCB0[0]-DCB0[7]). The memory units 200 are connected to each other. Each of the memory units 200 is controlled by the first word line WL and the second word line HWL. Each of the memory units 200 includes at least one sub-array memory cell module 210, at least one edge-delay cell multiplexor 220 (EDC MUX), at least one edge-delay cell 230 (EDC), at least one global bit line GBL and at least one global bit line bar GBLB. In one embodiment, the number of the at least one sub-array memory cell module 210 and the number of the at least one edge-delay cell multiplexor 220 may be 64, and the number of the at least one edge-delay cell 230 may be 256, but the present disclosure is not limited thereto.

Each of the sub-array memory cell modules 210 includes a first-column memory cell 212 and a second-column memory cell 214. The first-column memory cell 212 stores a first weight and is controlled by the first word line WL. The second-column memory cell 214 stores a second weight and is controlled by the first word line WL. The structure of the first-column memory cell 212 is the same as the structure of the second-column memory cell 214.

The first-column memory cell 212 includes a first node Q, a second node QB, a first-column local bit line LBL0, a first-column local bit line bar LBLB0, a first memory cell transistor T1, a second memory cell transistor T2, a first inverter INV1 and a second inverter INV2. The first node Q stores the first weight. The second node QB stores a first inverted weight opposite to the first weight of the first node Q. The first-column local bit line LBL0 is connected to the edge-delay cell multiplexor 220 and transmits the first weight from the first-column memory cell 212 to the edge-delay cell multiplexor 220. The first-column local bit line bar LBLB0 is connected to the edge-delay cell multiplexor 220 and transmits the first inverted weight from the first-column memory cell 212 to the edge-delay cell multiplexor 220. The first memory cell transistor T1 is connected to the first node Q, the first-column local bit line LBL0 and the first word line WL. The second memory cell transistor T2 is connected to the second node QB, the first-column local bit line bar LBLB0 and the first word line WL. The first inverter INV1 is located between the first node Q and the second node QB. The first inverter INV1 includes a third memory cell transistor T3 and a fourth memory cell transistor T4 connected to the third memory cell transistor T3. The second inverter INV2 is connected to the first inverter INV1. The second inverter INV2 includes a fifth memory cell transistor T5 and a sixth memory cell transistor T6 connected to the fifth memory cell transistor T5.

The second-column memory cell 214 includes a first node Q, a second node QB, a second-column local bit line LBL1, a second-column local bit line bar LBLB1, a first memory cell transistor T1, a second memory cell transistor T2, a first inverter INV1 and a second inverter INV2. The first node Q stores the second weight. The second node QB stores a second inverted weight opposite to the second weight of the first node Q. The second-column local bit line LBL1 is connected to the edge-delay cell multiplexor 220 and transmits the second weight from the second-column memory cell 214 to the edge-delay cell multiplexor 220. The second-column local bit line bar LBLB1 is connected to the edge-delay cell multiplexor 220 and transmits the second inverted weight from the second-column memory cell 214 to the edge-delay cell multiplexor 220. The first memory cell transistor T1 is connected to the first node Q, the second-column local bit line LBL1 and the first word line WL. The second memory cell transistor T2 is connected to the second node QB, the second-column local bit line bar LBLB1 and the first word line WL. The first inverter INV1 and the second inverter INV2 of the second-column memory cell 214 are the same as the first inverter INV1 and the second inverter INV2 of the first-column memory cell 212. In other words, each of the first-column memory cell 212 and the second-column memory cell 214 is a 6T static random access memory (SRAM) cell. Each of the first memory cell transistor T1, the second memory cell transistor T2, the third memory cell transistor T3 and the fifth memory cell transistor T5 is the NMOS transistor. Each of the fourth memory cell transistor T4 and the sixth memory cell transistor T6 is the PMOS transistor.

The edge-delay cell multiplexor 220 is connected to the sub-array memory cell module 210 and controlled by the second word line HWL. The edge-delay cell multiplexor 220 is configured to generate one of the first weight and the second weight. In detail, the edge-delay cell multiplexor 220 includes a selected local bit line LBLSEL, a selected local bit line bar LBLBSEL, a first edge-delay cell multiplex transistor P1, a second edge-delay cell multiplex transistor P2, a third edge-delay cell multiplex transistor N1, a fourth edge-delay cell multiplex transistor N2, a fifth edge-delay cell multiplex transistor N3 and a sixth edge-delay cell multiplex transistor N4. The selected local bit line LBLSEL is connected to the edge-delay cells 230 (e.g., EDC10[i], EDC32[i], EDC54[i], EDC76[i], where i=0-63). The selected local bit line bar LBLBSEL is connected to the edge-delay cells 230. The first edge-delay cell multiplex transistor P1 is configured to connect the global bit line GBL to the selected local bit line LBLSEL for read and write operations according to the second word line HWL. The second edge-delay cell multiplex transistor P2 is configured to connect the global bit line bar GBLB to the selected local bit line bar LBLBSEL for the read and write operations according to the second word line HWL. The third edge-delay cell multiplex transistor N1 is connected between the first-column local bit line LBL0 and the selected local bit line LBLSEL. The fourth edge-delay cell multiplex transistor N2 is connected between the first-column local bit line bar LBLB0 and the selected local bit line bar LBLBSEL. The fifth edge-delay cell multiplex transistor N3 is connected between the second-column local bit line LBL1 and the selected local bit line LBLSEL. The sixth edge-delay cell multiplex transistor N4 is connected between the second-column local bit line bar LBLB1 and the selected local bit line bar LBLBSEL. The third edge-delay cell multiplex transistor N1 and the fourth edge-delay cell multiplex transistor N2 are controlled by a first selecting signal SEL0. The fifth edge-delay cell multiplex transistor N3 and the sixth edge-delay cell multiplex transistor N4 are controlled by a second selecting signal SEL1, and the first selecting signal SEL0 is opposite to the second selecting signal SEL1. The first selecting signal SEL0 and the second selecting signal SEL1 are generated by the word line driver unit 300.

The edge-delay cell 230 (one of EDC10[i], EDC32[i], EDC54[i], EDC76[i]) is connected to the edge-delay cell multiplexor 220 and configured to receive a multi-bit analog input voltage (one of VIN10, VIN32, VIN54, VIN76), an edge-input signal (one of EIN10, EIN32, EIN54, EIN76) and the one of the first weight and the second weight. The edge-delay cell 230 is configured to generate an edge-output signal (one of EOUT10, EOUT32, EOUT54, EOUT76) having a delay time ($N \times \Delta t$, where N=0-3) according to the multi-bit analog input voltage, the edge-input signal and the one of the first weight and the second weight. The delay time ($N \times \Delta t$) of the edge-output signal (one of EOUT10, EOUT32, EOUT54, EOUT76) is positively correlated with the multi-bit analog input voltage (one of VIN10, VIN32, VIN54, VIN76) multiplied by the one of the first weight and the second weight.

The edge-delay cell 230 (e.g., EDC10[i] in FIG. 3) includes a weight reader 232 and a driver 234. The weight reader 232 is configured to receive the one of the first weight and the second weight and the multi-bit analog input voltage VIN10 and generate a multi-bit voltage MUL according to the one of the first weight and the second weight and the multi-bit analog input voltage VIN10. The driver 234 is connected to the weight reader 232 and configured to receive an edge-input signal EIN10. The driver 234 is configured to generate an edge-output signal EOUT10 having a delay time ($N \times \Delta t$) according to the edge-input signal EIN10 and the multi-bit voltage MUL. In detail, the weight reader 232 includes a first weight reader transistor N01 and a second weight reader transistor N02. The first weight reader transistor N01 is connected to the multi-bit voltage MUL, the selected local bit line LBLSEL of the edge-delay cell multiplexor 220 and the multi-bit analog input voltage VIN10. The second weight reader transistor N02 is connected to the multi-bit voltage MUL, the selected local bit line bar LBLBSEL of the edge-delay cell multiplexor 220 and the ground voltage VSS. In addition, the driver 234 includes a first driver transistor P3, a second driver transistor N03, a third driver transistor P4, a fourth driver transistor N04. The first driver transistor P3 is connected to a first power supply voltage EDCVDD1, the edge-input signal EIN10 and an internal delay voltage MID. The second driver transistor N03 is connected to the internal delay voltage MID, the edge-input signal EIN10 and the multi-bit voltage MUL. The third driver transistor P4 is connected to a second power supply voltage EDCVDD2, the internal delay voltage MID and the edge-output signal EOUT10. The fourth driver transistor N04 is connected to the edge-output signal EOUT10, a reset signal RESET and the ground voltage VSS. The first power supply voltage EDCVDD1 may be equal to the power supply voltage VDD. The second power supply voltage EDCVDD2 may be turned off for a period of time, thus saving power consumption, as shown in FIG. 4.

The global bit line GBL is connected to the edge-delay cell multiplexor 220. The global bit line bar GBLB is connected to the edge-delay cell multiplexor 220. The global bit line GBL and the global bit line bar GBLB is perpendicular to the first word line WL and the second word line HWL. Table 1 lists the weights (Weight), the multi-bit input values (IN[1:0]), the multi-bit analog input voltages (VIN10), the multi-bit output values (Value) and the delay times (Delay) of the edge-output signals EOUT10 of the edge-delay cell 230 of FIG. 3. The multi-bit output values (Value) can be computed by the multi-bit input values (IN[1:0]) and the weights (Weight). The weights (Weight) are corresponding to the voltage levels of the selected local bit line (LBLSEL). The multi-bit input values (IN[1:0]) are corresponding to the multi-bit analog input voltages (VIN10). The multi-bit output values (Value) are corresponding to the delay times (Delay) of the edge-output signals EOUT10. Each of the multi-bit analog input voltages (VIN10) may have fourth voltage levels which are equal to $V_{11}$ (e.g., 1.0 V), $V_{10}$ (e.g., 0.7 V), $V_{01}$ (e.g., 0.5 V) and VSS (0 V), respectively.

TABLE 1

| Weight | Input | | Input× Weight | |
| --- | --- | --- | --- | --- |
| LBLSEL | IN[1:0] | VIN10 | Value | Delay |
| 1 | 11 | $V_{11}$ | 3 | $t_0 + 3\Delta t$ |
|  | 10 | $V_{10}$ | 2 | $t_0 + 2\Delta t$ |
|  | 01 | $V_{01}$ | 1 | $t_0 + 1\Delta t$ |
|  | 00 | VSS | 0 | $t_0$ |
| 0 |  | Don't care | 0 | $t_0$ |

In FIG. 3, the number of the at least one edge-delay cell 230 is plural (e.g., EDC10[i], EDC32[i], EDC54[i], EDC76[i]). Each of the edge-delay cells 230 is connected to the edge-delay cell multiplexor 220 via the selected local bit line LBLSEL and the selected local bit line bar LBLBSEL. The edge-delay cells 230 are configured to receive the multi-bit analog input voltages VIN10, VIN32, VIN54, VIN76, the edge-input signals EIN10, EIN32, EIN54, EIN76 and the one of the first weight and the second weight. The edge-delay cells 230 are configured to generate the edge-output signals EOUT10, EOUT32, EOUT54, EOUT76 having a plurality of the delay times (N×Δt) according to the multi-bit analog input voltages VIN10, VIN32, VIN54, VIN76, the edge-input signals EIN10, EIN32, EIN54, EIN76 and the one of the first weight and the second weight.

In FIG. 2, the number of at least one sub-array memory cell module 210 is plural (e.g., 64). The number of the at least one edge-delay cell multiplexor 220 is plural (e.g., 64). The number of the at least one edge-delay cell 230 is plural (e.g., EDC10[0]-EDC10[63], that is EDC10[i], where i=0-63). The edge-delay cell multiplexors 220 are connected to the edge-delay cells 230 (e.g., EDC10[0]-EDC10[63]), respectively. The edge-delay cell multiplexors 220 are configured to transmit a plurality of weights $W_0[7]$-$W_{63}[7]$ (i.e., $W_i[7]$, where i=0-63) to each of the edge-delay cells 230 (e.g., EDC10[0]-EDC10[63]). One of the weights $W_0[7]$-$W_{63}[7]$ is the one of the first weight and the second weight. The edge-delay cells 230 (e.g., EDC10[0]-EDC10[63]) are configured to receive the multi-bit analog input voltages (e.g., $IN_i[1:0]$, where i=0-63), the edge-input signals (e.g., EIN10, E10[0]-E10[62]) and the weights $W_0[7]$-$W_{63}[7]$. The edge-delay cells 230 (e.g., EDC10[0]-EDC10[63]) are connected in series and configured to generate the edge-output signals (e.g., E10[0]-E10[62], EOUT10) having the delay times (N×Δt, where N=0-3), and the delay time of a last one (EOUT10) of the edge-output signals (e.g., E10[0]-E10[62], EOUT10) is positively correlated with a sum ($\Sigma_{i+0}^{63} IN_i[1:0] \times W_i[7]$) of the multi-bit analog input voltages (e.g., $IN_i[1:0]$, where i=0-63) multiplied by the weights $W_0[7]$-$W_{63}[7]$.

The word line driver unit 300 is connected to each of the memory units 200 via the first word line WL and the second word line HWL. The word line driver unit 300 is represented by "ESG & WL Driver" and is located on a left side of the memory units 200. "ESG" represents an edge-signal generator, i.e., the word line driver unit 300 includes the edge-signal generator and a word line driver. The edge-signal generator generates the edge-input signals EIN10, EIN32, EIN54, EIN76. The word line driver generates the voltage level of the first word line WL and the voltage level of the second word line HWL. The voltage level of the first word line WL, the voltage level of the second word line HWL and the edge-input signals EIN10, EIN32, EIN54, EIN76 are transmitted to each of the memory units 200 for computing. In other words, the edge-signal generator generates a rising-edge signal (e.g., the edge-input signal EIN10) at an input terminal EIN of the $1^{st}$ edge-delay cell 230 (e.g., EDC10[0]) of each of the memory units 200 and then output another rising-edge signal (e.g., the edge-output signal E10[0]) at an output terminal EOUT after a cell delay $T_{EDC}$. The cell delay $T_{EDC}$ depends on the product of 2 bIN×1 bW (i.e., $IN_0[1:0] \times W_0[7]$). The next edge-delay cell 230 is triggered only after the previous edge-delay cell 230 has generated the rising-edge signal at its output terminal EOUT, which travels through all sixty-four edge-delay cells 230 in the memory unit 200. The delay time of the rising-edge signals between the input terminal EIN of the $1^{st}$ edge-delay cell 230 and the output terminal EOUT of the $64^{th}$ edge-delay cell 230 (e.g., EDC10[63]) is equal to $\Sigma_{i+0}^{63} IN_i[1:0] \times W_i[7]$, which represents a plurality of partial multiplication-and-accumulation values (pMACV) of 64-channel accumulations of 2 bIN×1 bW.

The input driver 400 is connected to each of the memory units 200 via the global bit line GBL and the global bit line bar GBLB. The input driver 400 is located on a top side of the memory units 200. The input driver 400 generates the voltage level of the global bit line GBL and the voltage level of the global bit line bar GBLB according to the multi-bit input values (IN[1:0]).

The time-to-digital converter 500 (TDC) is connected to a last one (e.g., each of EDC10[63], EDC32[63], EDC54[63], EDC76[63]) of each row of the edge-delay cells 230 of the memory units 200 and receives the edge-output signals EOUT10, EOUT32, EOUT54, EOUT76. The time-to-digital converter 500 is represented by "TDC" and is located on a right side of the memory units 200. The time-to-digital converter 500 is configured to convert the delay time of each of the edge-output signals EOUT10, EOUT32, EOUT54, EOUT76 into the partial multiplication-and-accumulation value (pMACV) which is an integer value.

Therefore, the memory unit 200 with time domain edge delay accumulation for computing-in-memory applications of the present disclosure utilizes an unlimited characteristic of edge delay accumulation to improve the problem of restricted signal margin. Moreover, the edge-delay cell 230 has a simple circuit structure to save power consumption and improve the performance of CIM, and the sub-array memory cell module 210 including two memory cells (i.e., the first-column memory cell 212 and the second-column memory cell 214) can effectively save chip area, thus reducing manufacturing cost.

Figure 6:
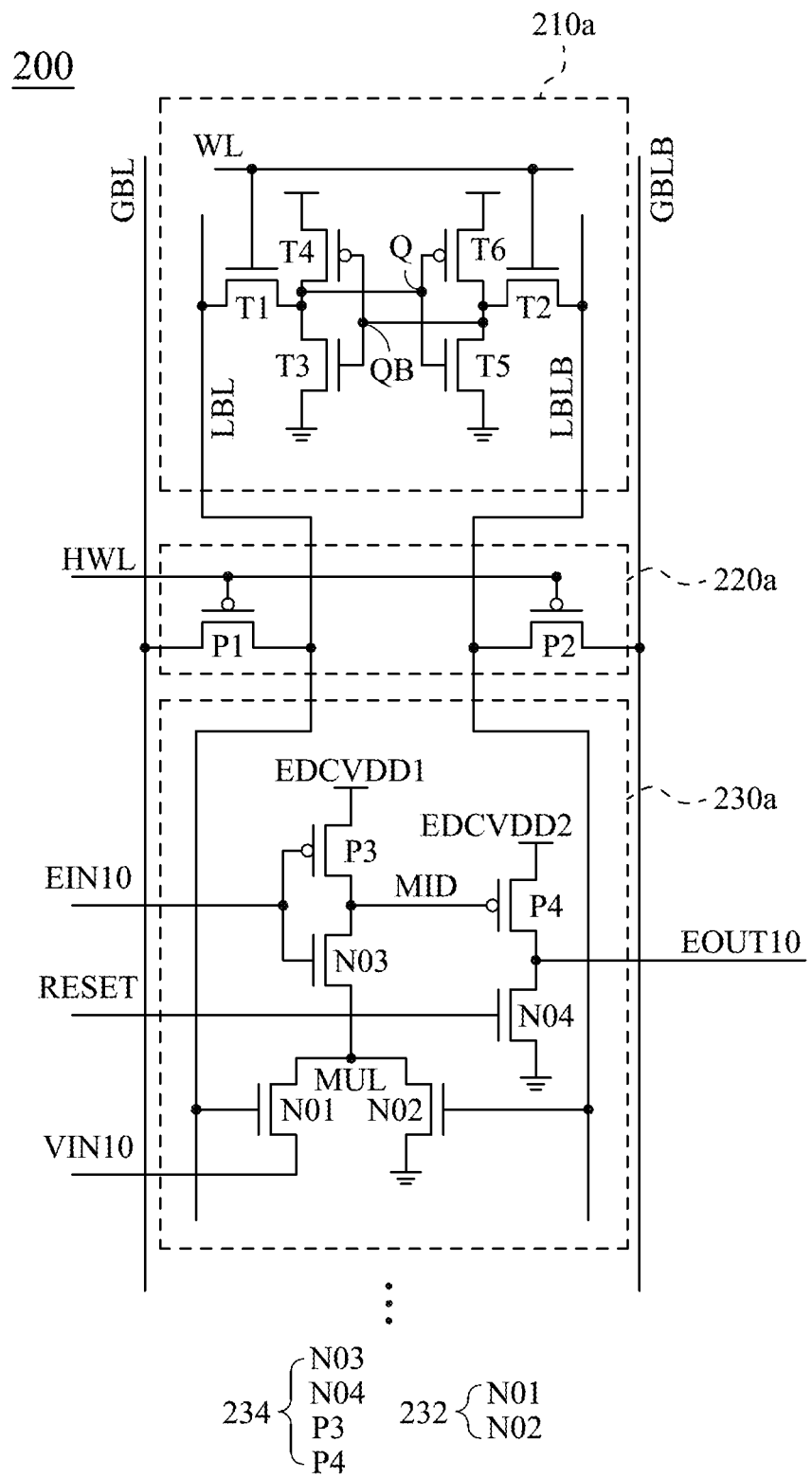
FIG. 6 shows a circuit diagram of a memory unit with time domain edge delay accumulation for computing-in-memory applications according to a second embodiment of the present disclosure.

Please refer to FIGS. 1, 3 and 6. FIG. 6 shows a circuit diagram of a memory unit 200 with time domain edge delay accumulation for computing-in-memory applications according to a second embodiment of the present disclosure. The memory unit 200 includes at least one sub-array memory cell module 210a, at least one edge-delay cell multiplexor 220a, at least one edge-delay cell 230a, at least one global bit line GBL and at least one global bit line bar GBLB. In one embodiment, the number of the at least one sub-array memory cell module 210a may be equal to the number of the at least one sub-array memory cell module 210. The number of the at least one edge-delay cell multiplexor 220a may be equal to the number of the at least one edge-delay cell multiplexor 220. The number of the at least one edge-delay cell 230a may be equal to the number of the at least one edge-delay cell 230, but the present disclosure is not limited thereto.

The sub-array memory cell module 210a includes a memory cell (6T SRAM) storing a weight. The memory cell is controlled by the first word line WL. The structure of the memory cell of the sub-array memory cell module 210a is the same as the structure of the first-column memory cell 212 of FIG. 3. The memory cell includes a first node Q, a second node QB, a local bit line LBL, a local bit line bar LBLB, a first memory cell transistor T1, a second memory cell transistor T2, a first inverter INV1 and a second inverter INV2. The first node Q stores the weight. The second node QB stores an inverted weight opposite to the weight of the first node Q. The local bit line LBL is connected to the edge-delay cell multiplexor 220a and transmits the weight from sub-array memory cell module 210a to the edge-delay cell multiplexor 220a. The local bit line bar LBLB is connected to the edge-delay cell multiplexor 220a and transmits the inverted weight from sub-array memory cell module 210a to the edge-delay cell multiplexor 220a. The first memory cell transistor T1 is connected to the first node Q, the local bit line LBL and the first word line WL. The second memory cell transistor T2 is connected to the second node QB, the local bit line bar LBLB and the first word line WL. The first inverter INV1 and the second inverter INV2 are the same as the first inverter INV1 and the second inverter INV2 of the first-column memory cell 212 of FIG. 3.

The edge-delay cell multiplexor 220a is connected to the memory cell and controlled by the second word line HWL. The edge-delay cell multiplexor 220a includes a first edge-delay cell multiplex transistor P1 and a second edge-delay cell multiplex transistor P2. The first edge-delay cell multiplex transistor P1 is configured to connect the global bit line GBL to the local bit line LBL for read and write operations according to the second word line HWL. The second edge-delay cell multiplex transistor P2 is configured to connect the global bit line bar GBLB to the local bit line bar LBLB for the read and write operations according to the second word line HWL.

The edge-delay cell 230a connected to the edge-delay cell multiplexor 220a and includes a weight reader 232 and a driver 234. The structure of the edge-delay cell 230a is the same as the structure of the edge-delay cell 230 of FIG. 3. The weight reader 232 is configured to receive the weight and a multi-bit analog input voltage VIN10 and generate a multi-bit voltage MUL according to the weight and the multi-bit analog input voltage VIN10. The driver 234 is connected to the weight reader 232 and configured to receive an edge-input signal EIN10. The driver 234 is configured to generate an edge-output signal EOUT10 having a delay time according to the edge-input signal EIN10 and the multi-bit voltage MUL. The delay time of the edge-output signal EOUT10 is positively correlated with the multi-bit analog input voltage VIN10 multiplied by the weight.

Therefore, the memory unit 200 with time domain edge delay accumulation for computing-in-memory applications of the present disclosure utilizes an unlimited characteristic of edge delay accumulation to improve the problem of restricted signal margin. Moreover, the edge-delay cell 230a has a simple circuit structure to save power consumption and improve the performance of CIM.

Figure 7:
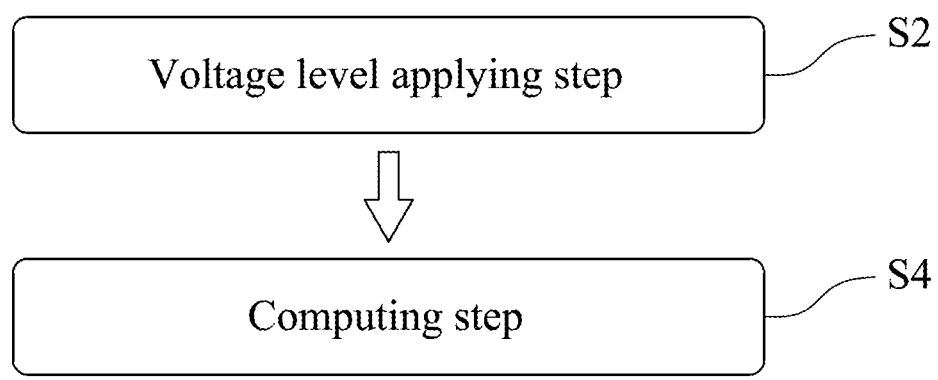
FIG. 7 shows a flow chart of a computing method of a memory unit with time domain edge delay accumulation for computing-in-memory applications according to a third embodiment of the present disclosure.

Please refer to FIGS. 1-7. FIG. 7 shows a flow chart of a computing method 600 of a memory unit with time domain edge delay accumulation for computing-in-memory applications according to a third embodiment of the present disclosure. The computing method 600 of a memory unit with time domain edge delay accumulation for computing-in-memory applications is controlled by a first word line WL and a second word line HWL. The memory unit may be the memory unit 200 of FIG. 2 or the memory unit 200 of FIG. 6. The computing method 600 includes performing a voltage level applying step S2 and a computing step S4.

The voltage level applying step S2 includes applying a plurality of voltage levels to the first word line WL, the second word line HWL, a weight, a multi-bit analog input voltage VIN10, an edge-input signal EIN10, a reset signal RESET, a first power supply voltage EDCVDD1 and a second power supply voltage EDCVDD2 of the memory unit, respectively.

The computing step S4 includes configuring at least one edge-delay cell (e.g., one of the edge-delay cells 230, 230a) of the memory unit to compute the multi-bit analog input voltage VIN10, the edge-input signal EIN10 and the weight to generate an edge-output signal EOUT10 having a delay time (N×Δt). The delay time of the edge-output signal EOUT10 is positively correlated with the multi-bit analog input voltage VIN10 multiplied by the weight. In addition, the computing step S4 further includes configuring a weight reader 232 of the at least one edge-delay cell to generate a multi-bit voltage MUL according to the weight and the multi-bit analog input voltage VIN10, and configuring a driver 234 of the at least one edge-delay cell to generate the edge-output signal EOUT10 having the delay time according to the edge-input signal EIN10 and the multi-bit voltage MUL.

Please refer to FIGS. 3 and 7. The number of the at least one edge-delay cell 230 is plural. The computing step S4 further includes configuring the edge-delay cells 230 to generate a plurality of the edge-output signals EOUT10, EOUT32, EOUT54, EOUT76 having a plurality of the delay times according to a plurality of the multi-bit analog input voltages VIN10, VIN32, VIN54, VIN76, a plurality of the edge-input signals EIN10, EIN32, EIN54, EIN76 and the weight.

Please refer to FIGS. 2 and 7. The number of at least one edge-delay cell multiplexor 220 of the memory unit is plural. The number of the at least one edge-delay cell 230 is plural. The computing step S4 further includes configuring the edge-delay cell multiplexors 220 to transmit a plurality of the weights $W_0[7]$-$W_{63}[7]$ to the edge-delay cells 230, and configuring the edge-delay cells 230 to receive a plurality of the multi-bit analog input voltages $IN_i[1:0]$, a plurality of the edge-input signals EIN10, E10[0]-E10[62] and the weights $W_0[7]$-$W_{63}[7]$, and then generate a plurality of the edge-output signals E10[0]-E10[62], EOUT10 having a plurality of the delay times. The delay time of a last one (EOUT10) of the edge-output signals E10[0]-E10[62], EOUT10 is positively correlated with a sum of the multi-bit analog input voltages $IN_i[1:0]$ multiplied by the weights $W_0[7]$-$W_{63}[7]$.

Therefore, the computing method 600 of the present disclosure can utilize an unlimited characteristic of edge delay accumulation to improve the problem of restricted signal margin and have higher sensing accuracy, thereby enhancing the performance of CIM.

According to the aforementioned embodiments and examples, the advantages of the present disclosure are described as follows.

1. The memory unit with time domain edge delay accumulation for computing-in-memory applications and the computing method thereof of the present disclosure utilize an unlimited characteristic of edge delay accumulation to improve the problem of restricted signal margin and have higher sensing accuracy.

2. The edge-delay cell of the present disclosure has a simple circuit structure to save power consumption and improve the performance of CIM.

3. The sub-array memory cell module including two memory cells can effectively save chip area, thus reducing manufacturing cost.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit with time domain edge delay accumulation for computing-in-memory applications, which is controlled by a first word line and a second word line, the memory unit with time domain edge delay accumulation for computing-in-memory applications comprising:
   at least one memory cell storing a weight, wherein the at least one memory cell is controlled by the first word line and comprises a local bit line transmitting the weight;
   at least one edge-delay cell multiplexor connected to the at least one memory cell and controlled by the second word line; and
   at least one edge-delay cell connected to the at least one edge-delay cell multiplexor and comprising:
      a weight reader configured to receive the weight and a multi-bit analog input voltage and generate a multi-bit voltage according to the weight and the multi-bit analog input voltage; and
      a driver connected to the weight reader and configured to receive an edge-input signal, wherein the driver is configured to generate an edge-output signal having a delay time according to the edge-input signal and the multi-bit voltage;
   wherein the delay time of the edge-output signal is positively correlated with the multi-bit analog input voltage multiplied by the weight.

2. The memory unit with time domain edge delay accumulation for computing-in-memory applications of claim 1, wherein the at least one memory cell further comprises:
   a first node storing the weight;
   a second node storing an inverted weight opposite to the weight of the first node;
   a local bit line bar connected to the at least one edge-delay cell multiplexor and transmitting the inverted weight to the at least one edge-delay cell multiplexor;
   a first memory cell transistor connected to the first node, the local bit line and the first word line;
   a second memory cell transistor connected to the second node, the local bit line bar and the first word line;
   a first inverter located between the first node and the second node; and
   a second inverter connected to the first inverter.

3. The memory unit with time domain edge delay accumulation for computing-in-memory applications of claim 2, further comprising:
   a global bit line connected to the at least one edge-delay cell multiplexor; and
   a global bit line bar connected to the at least one edge-delay cell multiplexor;
   wherein the at least one edge-delay cell multiplexor comprises:
      a first edge-delay cell multiplex transistor configured to connect the global bit line to the local bit line for read and write operations according to the second word line; and
      a second edge-delay cell multiplex transistor configured to connect the global bit line bar to the local bit line bar for the read and write operations according to the second word line.

4. The memory unit with time domain edge delay accumulation for computing-in-memory applications of claim 2, wherein the weight reader comprises:
   a first weight reader transistor connected to the multi-bit voltage, the local bit line and the multi-bit analog input voltage; and
   a second weight reader transistor connected to the multi-bit voltage, the local bit line bar and a ground voltage.

5. The memory unit with time domain edge delay accumulation for computing-in-memory applications of claim 1, wherein the driver comprises:
   a first driver transistor connected to a first power supply voltage, the edge-input signal and an internal delay voltage;
   a second driver transistor connected to the internal delay voltage, the edge-input signal and the multi-bit voltage;
   a third driver transistor connected to a second power supply voltage, the internal delay voltage and the edge-output signal; and
   a fourth driver transistor connected to the edge-output signal, a reset signal and a ground voltage.

6. The memory unit with time domain edge delay accumulation for computing-in-memory applications of claim 1, wherein a number of the at least one edge-delay cell is plural, each of the edge-delay cells is connected to the at least one edge-delay cell multiplexor via the local bit line, the edge-delay cells are configured to receive a plurality of the multi-bit analog input voltages, a plurality of the edge-input signals and the weight, and the edge-delay cells are configured to generate a plurality of the edge-output signals having a plurality of the delay times according to the multi-bit analog input voltages, the edge-input signals and the weight.

7. The memory unit with time domain edge delay accumulation for computing-in-memory applications of claim 1, wherein a number of the at least one edge-delay cell multiplexor is plural, a number of the at least one edge-delay cell is plural, the edge-delay cell multiplexors are connected to the edge-delay cells, respectively, the edge-delay cell multiplexors are configured to transmit a plurality of the weights to the edge-delay cells, the edge-delay cells are configured to receive a plurality of the multi-bit analog input voltages, a plurality of the edge-input signals and the weights, the edge-delay cells are connected in series and configured to generate a plurality of the edge-output signals having a plurality of the delay times, and the delay time of a last one of the edge-output signals is positively correlated with a sum of the multi-bit analog input voltages multiplied by the weights.

8. A memory unit with time domain edge delay accumulation for computing-in-memory applications, which is controlled by a first word line and a second word line, the memory unit with time domain edge delay accumulation for computing-in-memory applications comprising:
at least one sub-array memory cell module comprising:
at least one first-column memory cell storing a first weight, wherein the at least one first-column memory cell is controlled by the first word line and comprises a first-column local bit line transmitting the first weight; and
at least one second-column memory cell storing a second weight, wherein the at least one second-column memory cell is controlled by the first word line and comprises a second-column local bit line transmitting the second weight;
at least one edge-delay cell multiplexor connected to the at least one sub-array memory cell module and controlled by the second word line, wherein the at least one edge-delay cell multiplexor is configured to generate one of the first weight and the second weight; and
at least one edge-delay cell connected to the at least one edge-delay cell multiplexor and configured to receive a multi-bit analog input voltage, an edge-input signal and the one of the first weight and the second weight, wherein the at least one edge-delay cell is configured to generate an edge-output signal having a delay time according to the multi-bit analog input voltage, the edge-input signal and the one of the first weight and the second weight;
wherein the delay time of the edge-output signal is positively correlated with the multi-bit analog input voltage multiplied by the one of the first weight and the second weight.

9. The memory unit with time domain edge delay accumulation for computing-in-memory applications of claim 8, wherein,
the at least one first-column memory cell further comprises a first-column local bit line bar, wherein the first-column local bit line bar is connected to the at least one edge-delay cell multiplexor and transmits a first inverted weight opposite to the first weight to the at least one edge-delay cell multiplexor;
the at least one second-column memory cell further comprises a second-column local bit line bar, wherein the second-column local bit line bar is connected to the at least one edge-delay cell multiplexor and transmits a second inverted weight opposite to the second weight to the at least one edge-delay cell multiplexor.

10. The memory unit with time domain edge delay accumulation for computing-in-memory applications of claim 9, further comprising:
a global bit line connected to the at least one edge-delay cell multiplexor; and
a global bit line bar connected to the at least one edge-delay cell multiplexor;
wherein the at least one edge-delay cell multiplexor comprises:
a selected local bit line connected to the at least one edge-delay cell;
a selected local bit line bar connected to the at least one edge-delay cell;
a first edge-delay cell multiplex transistor configured to connect the global bit line to the selected local bit line for read and write operations according to the second word line; and
a second edge-delay cell multiplex transistor configured to connect the global bit line bar to the selected local bit line bar for the read and write operations according to the second word line.

11. The memory unit with time domain edge delay accumulation for computing-in-memory applications of claim 10, wherein the at least one edge-delay cell multiplexor further comprises:
a third edge-delay cell multiplex transistor connected between the first-column local bit line and the selected local bit line;
a fourth edge-delay cell multiplex transistor connected between the first-column local bit line bar and the selected local bit line bar;
a fifth edge-delay cell multiplex transistor connected between the second-column local bit line and the selected local bit line; and
a sixth edge-delay cell multiplex transistor connected between the second-column local bit line bar and the selected local bit line bar;
wherein the third edge-delay cell multiplex transistor and the fourth edge-delay cell multiplex transistor are controlled by a first selecting signal, the fifth edge-delay cell multiplex transistor and the sixth edge-delay cell multiplex transistor are controlled by a second selecting signal, and the first selecting signal is opposite to the second selecting signal.

12. The memory unit with time domain edge delay accumulation for computing-in-memory applications of claim 8, wherein the at least one edge-delay cell comprises:
a weight reader configured to receive the one of the first weight and the second weight and the multi-bit analog input voltage and generate a multi-bit voltage according to the one of the first weight and the second weight and the multi-bit analog input voltage; and
a driver connected to the weight reader and configured to receive an edge-input signal, wherein the driver is configured to generate an edge-output signal having a delay time according to the edge-input signal and the multi-bit voltage.

13. The memory unit with time domain edge delay accumulation for computing-in-memory applications of claim 12, wherein the weight reader comprises:
a first weight reader transistor connected to the multi-bit voltage, a selected local bit line of the at least one edge-delay cell multiplexor and the multi-bit analog input voltage; and
a second weight reader transistor connected to the multi-bit voltage, a selected local bit line bar of the at least one edge-delay cell multiplexor and a ground voltage.

14. The memory unit with time domain edge delay accumulation for computing-in-memory applications of claim 12, wherein the driver comprises:
a first driver transistor connected to a first power supply voltage, the edge-input signal and an internal delay voltage;
a second driver transistor connected to the internal delay voltage, the edge-input signal and the multi-bit voltage;
a third driver transistor connected to a second power supply voltage, the internal delay voltage and the edge-output signal; and
a fourth driver transistor connected to the edge-output signal, a reset signal and a ground voltage.

15. The memory unit with time domain edge delay accumulation for computing-in-memory applications of claim 8, wherein a number of the at least one edge-delay cell is plural, each of the edge-delay cells is connected to the at least one edge-delay cell multiplexor via a selected local bit line, the edge-delay cells are configured to receive a plurality of the multi-bit analog input voltages, a plurality of the edge-input signals and the one of the first weight and the second weight, and the edge-delay cells are configured to generate a plurality of the edge-output signals having a plurality of the delay times according to the multi-bit analog input voltages, the edge-input signals and the one of the first weight and the second weight.

16. The memory unit with time domain edge delay accumulation for computing-in-memory applications of claim 8, wherein a number of the at least one edge-delay cell multiplexor is plural, a number of the at least one edge-delay cell is plural, the edge-delay cell multiplexors are connected to the edge-delay cells, respectively, the edge-delay cell multiplexors are configured to transmit a plurality of weights to each of the edge-delay cells, one of the weights is the one of the first weight and the second weight, the edge-delay cells are configured to receive a plurality of the multi-bit analog input voltages, a plurality of the edge-input signals and the weights, the edge-delay cells are connected in series and configured to generate a plurality of the edge-output signals having a plurality of the delay times, and the delay time of a last one of the edge-output signals is positively correlated with a sum of the multi-bit analog input voltages multiplied by the weights.

17. A computing method of a memory unit with time domain edge delay accumulation for computing-in-memory applications, which is controlled by a first word line and a second word line, the computing method comprising:
  performing a voltage level applying step, wherein the voltage level applying step comprises applying a plurality of voltage levels to the first word line and the second word line of the memory unit, respectively; and
  performing a computing step, wherein the computing step comprises configuring at least one edge-delay cell of the memory unit to compute a multi-bit analog input voltage, an edge-input signal and a weight to generate an edge-output signal having a delay time;
  wherein the memory unit comprises:
    at least one memory cell storing the weight, wherein the at least one memory cell is controlled by the first word line and comprises a local bit line transmitting the weight;
    at least one edge-delay cell multiplexor connected to the at least one memory cell and controlled by the second word line; and
    the at least one edge-delay cell connected to the at least one edge-delay cell multiplexor and comprising:
      a weight reader configured to receive the weight and the multi-bit analog input voltage and generate a multi-bit voltage according to the weight and the multi-bit analog input voltage; and
      a driver connected to the weight reader and configured to receive the edge-input signal, wherein the driver is configured to generate the edge-output signal having the delay time according to the edge-input signal and the multi-bit voltage;
  wherein the delay time of the edge-output signal is positively correlated with the multi-bit analog input voltage multiplied by the weight.

18. The computing method of claim 17, wherein the computing step further comprises:
  configuring the weight reader of the at least one edge-delay cell to generate the multi-bit voltage according to the weight and the multi-bit analog input voltage; and
  configuring the driver of the at least one edge-delay cell to generate the edge-output signal having the delay time according to the edge-input signal and the multi-bit voltage.

19. The computing method of claim 17, wherein a number of the at least one edge-delay cell is plural, and the computing step further comprises:
  configuring the edge-delay cells to generate a plurality of the edge-output signals having a plurality of the delay times according to a plurality of the multi-bit analog input voltages, a plurality of the edge-input signals and the weight.

20. The computing method of claim 17, wherein a number of the at least one edge-delay cell multiplexor of the memory unit is plural, a number of the at least one edge-delay cell is plural, and the computing step further comprises:
  configuring the edge-delay cell multiplexors to transmit a plurality of the weights to the edge-delay cells; and
  configuring the edge-delay cells to receive a plurality of the multi-bit analog input voltages, a plurality of the edge-input signals and the weights, and then generate a plurality of the edge-output signals having a plurality of the delay times;
  wherein the delay time of a last one of the edge-output signals is positively correlated with a sum of the multi-bit analog input voltages multiplied by the weights.

* * * * *